(12) United States Patent
Li et al.

(10) Patent No.: US 11,467,684 B2
(45) Date of Patent: Oct. 11, 2022

(54) TOUCH DISPLAY PANEL

(71) Applicant: HannStar Display Corporation, Taipei (TW)

(72) Inventors: Meng-Ju Li, Tainan (TW); Mei-Ling Chou, Tainan (TW); Ding-Wei Liu, Kaohsiung (TW); Wei-Chih Hsu, Taichung (TW); Chen-Hao Su, Taichung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 17/242,313

(22) Filed: Apr. 28, 2021

(65) Prior Publication Data

US 2021/0373693 A1 Dec. 2, 2021

(30) Foreign Application Priority Data

May 26, 2020 (CN) .......................... 202010455251.4

(51) Int. Cl.
| G06F 3/041 | (2006.01) |
| G06F 3/044 | (2006.01) |
| H01L 27/32 | (2006.01) |
| G02F 1/1333 | (2006.01) |

(52) U.S. Cl.
CPC ............ G06F 3/0412 (2013.01); G06F 3/044 (2013.01); *G02F 1/13338* (2013.01); *G06F 2203/04112* (2013.01); *H01L 27/323* (2013.01)

(58) Field of Classification Search
CPC .................. G06F 3/0412; G06F 3/044; G06F 2203/04112; G02F 1/13338; H01L 27/323
See application file for complete search history.

(56) References Cited

U.S. PATENT DOCUMENTS

2021/0013241 A1\* 1/2021 Lin ........................ G02F 1/1368
2021/0232263 A1\* 7/2021 Feng ..................... G06F 3/0446

\* cited by examiner

*Primary Examiner* — Peter D McLoone
(74) *Attorney, Agent, or Firm* — JCIPRNET

(57) ABSTRACT

The disclosure provides a touch display panel including a substrate and a first mesh electrode. The first mesh electrode is disposed on the substrate and includes a plurality of first extending portions, a plurality of second extending portions, and a plurality of first disconnection regions. The first extending portions are arranged along a first direction and extend in a second direction. The first direction intersects with the second direction. The second extending portions are arranged along the second direction and extend in the first direction. The first disconnection regions are arranged along the first direction and extend in the second direction. The first disconnection regions overlap the second extending portions and do not overlap the first extending portions.

19 Claims, 11 Drawing Sheets

TOUCH DISPLAY PANEL

CROSS-REFERENCE TO RELATED APPLICATION

This application claims the priority benefit of China application serial no. 202010455251.4, filed on May 26, 2020. The entirety of the above-mentioned patent application is hereby incorporated by reference herein and made a part of this specification.

BACKGROUND OF THE INVENTION

1. Field of the Invention

The disclosure relates to a display panel, and more particularly, to a touch display panel.

2. Description of Related Art

In recent years, people have become increasingly dependent on electronic products. In order to achieve the purpose of being more convenient, light and thin in appearance, and more user-friendly, input devices for many information products have experienced a change from traditional keyboards or mouse to touch panels, and a display panel with a touch function has become standard configuration for current mobile devices. Due to the advantages of quick response, good reliability, and high durability, the capacitive touch technology has become the mainstream of the current touch technology, and is widely used in related electronic products (such as a mobile phone, a tablet computer, or a smart watch). According to the integration manner of the touch technology and the display panel, a capacitive touch display panel may be roughly classified into three types: out-cell, on-cell, and in-cell.

For example, an out-cell or on-cell touch display panel may dispose a touch electrode layer on a side of the display panel close to a user, so that the touch electrode can better sense a touch action of the user. In addition, in order to increase a transmission speed (or sensing frequency) of a sensing signal, the touch electrode layer is mostly made of metal material, and touch structure such as grid-like metal is widely accepted and applied in the market. Since the touch electrode layer of the foregoing grid-like metal needs to be cut into a plurality of touch electrodes, breakaway regions may exist between the touch electrodes, and the breakaway regions are easily detected by human eyes under the irradiation of backlight or external ambient light of the display panel, thereby causing various problems of visual effects. Therefore, how to overcome the foregoing problem is an important issue for related manufacturers.

SUMMARY OF THE INVENTION

The disclosure provides a touch display panel, which resolves the problem of visual effects and improves display quality.

The touch display panel of the disclosure includes a substrate and a first mesh electrode. The first mesh electrode is disposed on the substrate and includes a plurality of first extending portions, a plurality of second extending portions, and a plurality of first disconnection regions. The first extending portions are arranged along a first direction and extend in a second direction. The first direction intersects with the second direction. The second extending portions are arranged along the second direction and extend in the first direction. The first disconnection regions are arranged along the first direction and extend in the second direction. The first disconnection regions overlap the second extending portions and do not overlap the first extending portions.

In an embodiment of the disclosure, the foregoing touch display panel further includes a second mesh electrode disposed on a substrate. The second mesh electrode includes a plurality of third extending portions, a plurality of fourth extending portions, and a plurality of second disconnection regions. The third extending portions are alternately arranged with a plurality of first extending portions in a first direction. The fourth extending portions are alternately arranged with a plurality of second extending portions in a second direction. The second disconnection regions are arranged along the second direction and extend in the first direction. The plurality of second disconnection regions overlap the third extending portions and do not overlap the fourth extending portions.

In an embodiment of the disclosure, the plurality of first disconnection regions of the foregoing touch display panel are arranged on the substrate in a period P1. The plurality of first extending portions are arranged on the substrate in a period P2, the period P1 being not an integer multiple of the period P2.

In an embodiment of the disclosure, the substrate of the foregoing touch display panel further includes a first side edge parallel to the first extending portion. A shortest distance $\alpha 1$ exists between the plurality of first disconnection regions and the first side edge. At least one of the plurality of first disconnection regions has a width $\alpha 2$. The plurality of first disconnection regions are arranged on the substrate in a period P1. A shortest distance C1 exists between the plurality of first extending portions and the first side edge. At least one of vertical projections of the plurality of first extending portions on the second extending portions has a width C2. The plurality of first extending portions are arranged on the substrate in a period P2. The plurality of first disconnection regions are respectively located within a coordinate range of $[(n-1)\ P1+\alpha 1]$ to $[(n-1)\ P1+\alpha 1+\alpha 2]$ based on the first side edge. The plurality of first extending portions are respectively located within a coordinate range of $[(m-1)\ P2+C1]$ to $[(m-1)\ P2+C1+C2]$ based on the first side edge, the coordinate range of $[(n-1)\ P1+\alpha 1]$ to $[(n-1)\ P1+\alpha 1+\alpha 2]$ not overlapping the coordinate range of $[(m-1)\ P2+C1]$ to $[(m-1)\ P2+C1+C2]$, where m and n are positive integers.

In an embodiment of the disclosure, the plurality of second disconnection regions of the foregoing touch display panel are arranged on the substrate in a period P3. The plurality of fourth extending portions are arranged on the substrate in a period P4, the period P3 being not an integer multiple of the period P4.

In an embodiment of the disclosure, the substrate of the foregoing touch display panel further includes a side edge parallel to the fourth extending portion. A shortest distance $\beta 1$ exists between the plurality of second disconnection regions and the side edge. At least one of the plurality of second disconnection regions has a width $\beta 2$. The plurality of second disconnection regions are arranged on the substrate in a period P3. A shortest distance C1' exists between the plurality of fourth extending portions and the side edge. At least one of vertical projections of the plurality of fourth extending portions on the third extending portions has a width C2'. The plurality of fourth extending portions are arranged on the substrate in a period P4. The plurality of second disconnection regions are respectively located within a coordinate range of $[(t-1)\ P3+\beta 1]$ to $[(t-1)\ P3+\beta 1+\beta 2]$ based on the side edge. The plurality of fourth extending portions are respectively located within a coordinate range of [(s−1) P4+C1'] to [(s−1) P4+C1'+C2'] based on the side edge, the coordinate range of [(t−1) P3+β1] to [(t−1) P3+β1+β2] not overlapping the coordinate range of [(s−1) P4+C1'] to [(s−1) P4+C1'+C2'], where s and t are positive integers.

In an embodiment of the disclosure, the first mesh electrode of the foregoing touch display panel further includes a plurality of second disconnection regions alternately arranged with the plurality of first disconnection regions in the first direction. The plurality of second disconnection regions overlap the plurality of second extending portions, and do not overlap the plurality of first extending portions.

In an embodiment of the disclosure, the substrate of the foregoing touch display panel further includes a first side edge parallel to the first extending portion. A shortest distance α1 exists between the plurality of first disconnection regions and the first side edge. A distance α3 exists between the adjacent first disconnection regions and second disconnection regions. At least one of the plurality of first disconnection regions has a width α2, and at least one of the plurality of second disconnection regions has a width α4. The plurality of first disconnection regions are arranged on the substrate in a period P1. A shortest distance C1 exists between the plurality of first extending portions and the first side edge. At least one of vertical projections of the plurality of first extending portions on the second extending portions has a width C2. The plurality of first extending portions are arranged on the substrate in a period P2. The plurality of second disconnection regions are respectively located within a coordinate range of [(n−1) P1+α1+α2+α3] to [(n−1) P1+α1+α2+α3+α4] based on the first side edge. The plurality of first extending portions are respectively located within a coordinate range of [(m−1) P2+C1] to [(m−1) P2+C1+C2] based on the first side edge, the coordinate range of [(n−1) P1+α1+α2+α3] to [(n−1) P1+α1+α2+α3+α4] not overlapping the coordinate range of [(m−1) P2+C1] to [(m−1) P2+C1+C2], where m and n are positive integers.

In an embodiment of the disclosure, the second mesh electrode of the foregoing touch display panel further includes a plurality of third disconnection regions alternately arranged with the plurality of second disconnection regions in the second direction. The plurality of third disconnection regions overlap the plurality of third extending portions, and do not overlap the plurality of fourth extending portions.

In an embodiment of the disclosure, the substrate of the foregoing touch display panel further includes a side edge parallel to the fourth extending portion. A shortest distance β1 exists between the plurality of second disconnection regions and the side edge. A distance β3 exists between the adjacent second disconnection regions and third disconnection regions. At least one of the plurality of second disconnection regions has a width β2, and at least one of the plurality of third disconnection regions has a width β4. The plurality of second disconnection regions are arranged on the substrate in a period P3. A shortest distance C1' exists between the plurality of fourth extending portions and the side edge, at least one of vertical projections of the plurality of fourth extending portions on the third extending portions having a width C2'. The plurality of fourth extending portions are arranged on the substrate in a period P4. The plurality of third disconnection regions are respectively located within a coordinate range of [(t−1) P3+β1+β2+β3] to [(t−1) P3+β1+β2+β3+β4] based on the side edge. The plurality of fourth extending portions are respectively located within a coordinate range of [(s−1) P4+C1'] to [(s−1) P4+C1'+C2'] based on the side edge, the coordinate range of [(t−1) P3+β1+β2+β3] to [(t−1) P3+β1+β2+β3+β4] not overlapping the coordinate range of [(s−1) P4+C1'] to [(s−1) P4+C1'+C2'], where s and t are positive integers.

In an embodiment of the disclosure, the plurality of first disconnection regions of the foregoing touch display panel are arranged on the substrate in a first period. The plurality of first extending portions are arranged on the substrate in a second period, the first period being an integer multiple of the second period.

In an embodiment of the disclosure, the plurality of second disconnection regions of the foregoing touch display panel are arranged on the substrate in a first period. The plurality of fourth extending portions are arranged on the substrate in a second period, the first period being an integer multiple of the second period.

In an embodiment of the disclosure, the foregoing touch display panel further includes a second mesh electrode. The second mesh electrode is disposed on the substrate, and includes a plurality of third extending portions, a plurality of fourth extending portions, and a plurality of second disconnection regions. The third extending portions are alternately arranged with the plurality of first extending portions in the first direction. The fourth extending portions are not alternately arranged with the plurality of second extending portions in the second direction. The second disconnection regions are arranged along the second direction and extend in the first direction. The second disconnection regions overlap the third extending portions and do not overlap the fourth extending portions.

In an embodiment of the disclosure, the plurality of second disconnection regions of the foregoing touch display panel are arranged on the substrate in a period P3. The plurality of fourth extending portions are arranged on the substrate in a period P4, the period P3 being not an integer multiple of the period P4.

In an embodiment of the disclosure, the substrate of the foregoing touch display panel further includes a side edge parallel to the fourth extending portion. A shortest distance β1 exists between the plurality of second disconnection regions and the side edge. At least one of the plurality of second disconnection regions has a width β2. A shortest distance C1' exists between the plurality of fourth extending portions and the side edge, at least one of vertical projections of the plurality of fourth extending portions on the third extending portions having a width C2'. The plurality of second disconnection regions are respectively located within a coordinate range of [(t−1) P3+β1] to [(t−1) P3+β1+β2] based on the side edge. The plurality of fourth extending portions are respectively located within a coordinate range of [(s−1) P4+C1'] to [(s−1) P4+C1'+C2'] based on the side edge, the coordinate range of [(t−1) P3+β1] to [(t−1) P3+β1+β2] not overlapping the coordinate range of [(s−1) P4+C1'] to [(s−1) P4+C1'+C2'], where s and t are positive integers.

In an embodiment of the disclosure, the second mesh electrode of the foregoing touch display panel further includes a plurality of third disconnection regions alternately arranged with the plurality of second disconnection regions in the second direction. The third disconnection regions overlap the plurality of third extending portions, and do not overlap the plurality of fourth extending portions.

In an embodiment of the disclosure, the substrate of the foregoing touch display panel further includes a side edge parallel to the fourth extending portion. A shortest distance β1 exists between the plurality of second disconnection regions and the side edge. A distance β3 exists between the adjacent second disconnection regions and third disconnection regions. At least one of the plurality of second disconnection regions and the plurality of third disconnection regions has a width $\beta2$. A shortest distance $C1'$ exists between the plurality of fourth extending portions and the side edge, at least one of vertical projections of the plurality of fourth extending portions on the third extending portions having a width $C2'$. The plurality of third disconnection regions are respectively located within a coordinate range of $[(t-1) P3+\beta1+\beta2+\beta3]$ to $[(t-1) P3+\beta1+\beta2+\beta3+\beta4]$ based on the side edge. The plurality of fourth extending portions are respectively located within a coordinate range of $[(s-1) P4+C1']$ to $[(s-1) P4+C1'+C2']$ based on the side edge, the coordinate range of $[(t-1) P3+\beta1+\beta2+\beta3]$ to $[(t-1) P3+\beta1+\beta2+\beta3+\beta4]$ not overlapping the coordinate range of $[(s-1) P4+C1']$ to $[(s-1) P4+C1'+C2']$, where s and t are positive integers.

In an embodiment of the disclosure, the foregoing touch display panel further includes an insulation layer disposed between the first mesh electrode and the second mesh electrode.

In an embodiment of the disclosure, the first mesh electrode and the second mesh electrode of the foregoing touch display panel are disposed on a same layer, and the first mesh electrode is electrically independent of the second mesh electrode.

In an embodiment of the disclosure, the foregoing touch display panel further includes a display medium layer and a pixel array substrate. The display medium layer is disposed between the pixel array substrate and the substrate.

Based on the above, in the touch display panel according to an embodiment of the disclosure, the mesh electrode has a plurality of first extending portions and a plurality of second extending portions, the first extending portions intersecting with the second extending portions.

In order to achieve partition sensing, the mesh electrode further includes a plurality of disconnection regions. The disconnection regions are caused to overlap the second extending portions and not to overlap the first extending portions, so that visibility of the disconnection regions of the mesh electrode can be reduced, and the display quality of the touch display panel can be improved.

To make the features and advantages of the disclosure clear and easy to understand, the following gives a detailed description of embodiments with reference to accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
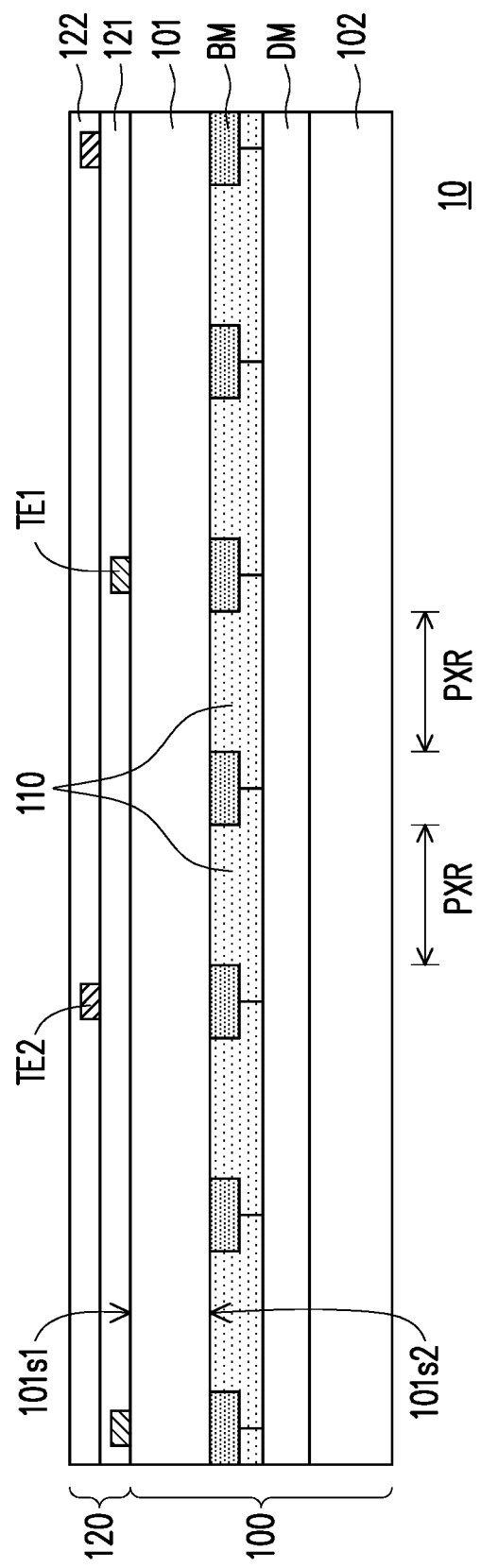
FIG. 1 is a schematic cross-sectional view of a touch display panel according to a first embodiment of the disclosure.

Exemplary embodiments of the disclosure are described in detail, and examples of the exemplary embodiments are shown in the accompanying drawings. Whenever possible, the same element symbols are used in the drawings and descriptions to indicate the same or similar parts.

Figure 2:
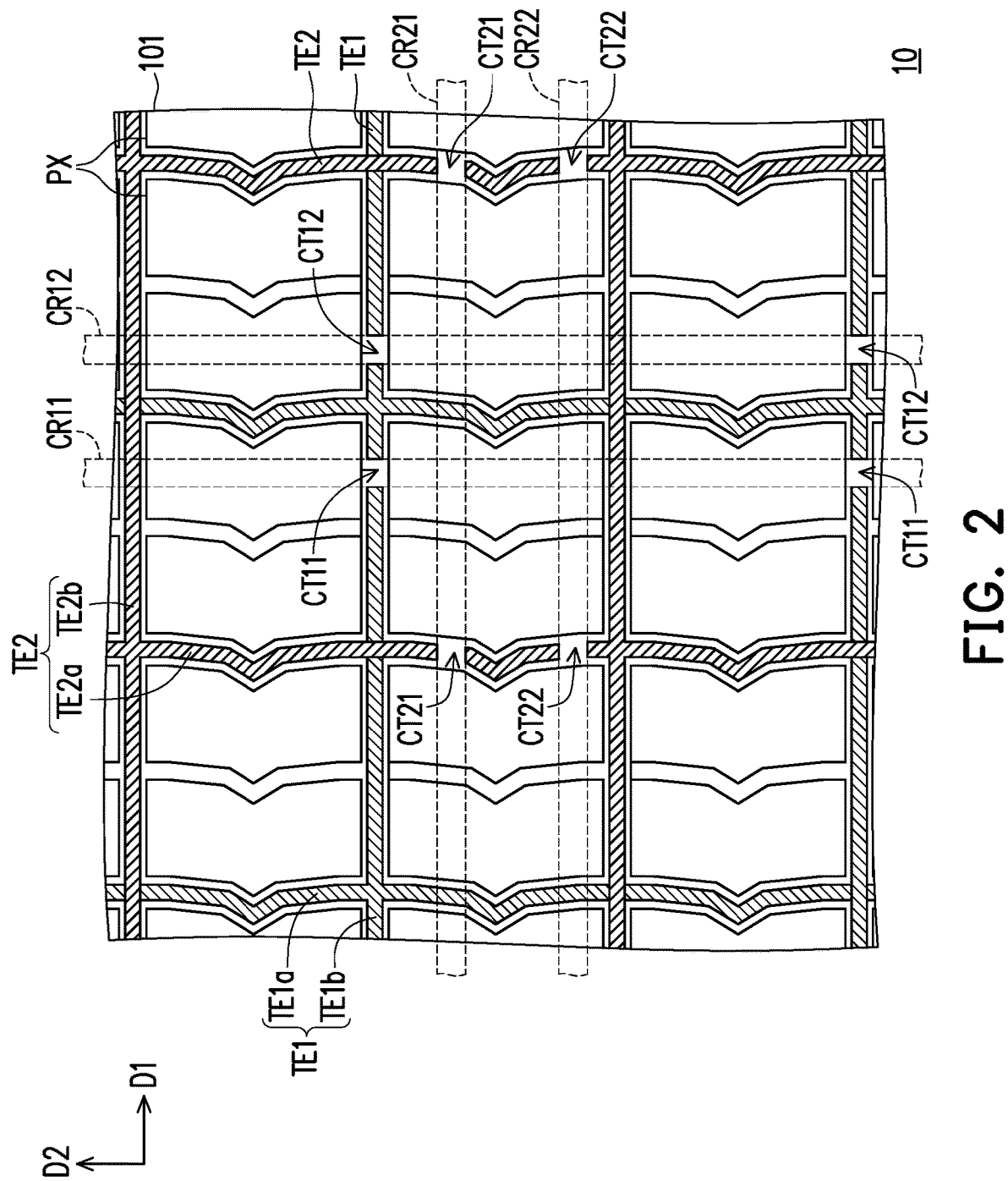
FIG. 2 is a schematic top view of a touch display panel according to the first embodiment of the disclosure.
Figure 3:
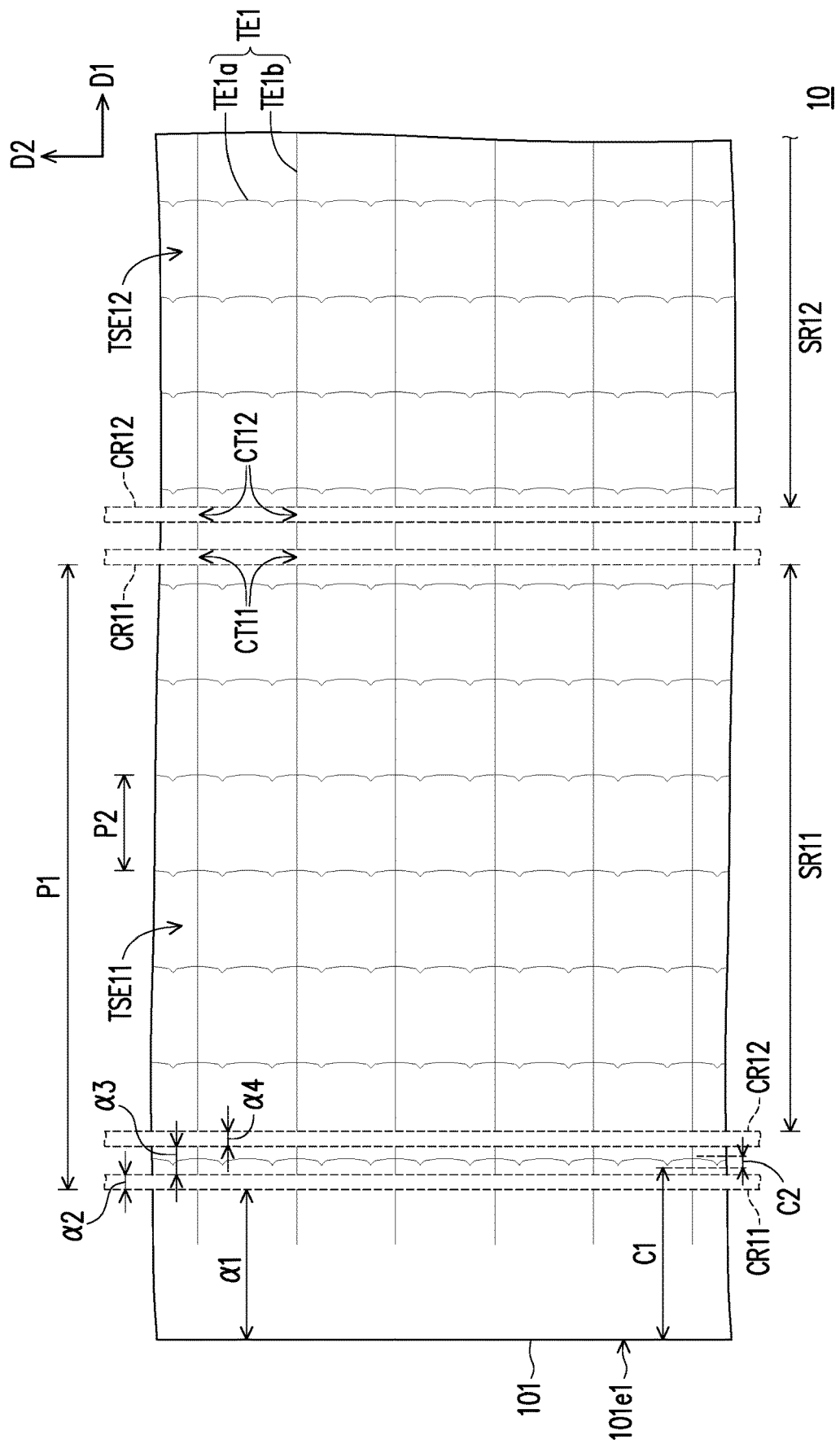
FIG. 3 is a schematic top view of a first mesh electrode in FIG. 1.
Figure 4:
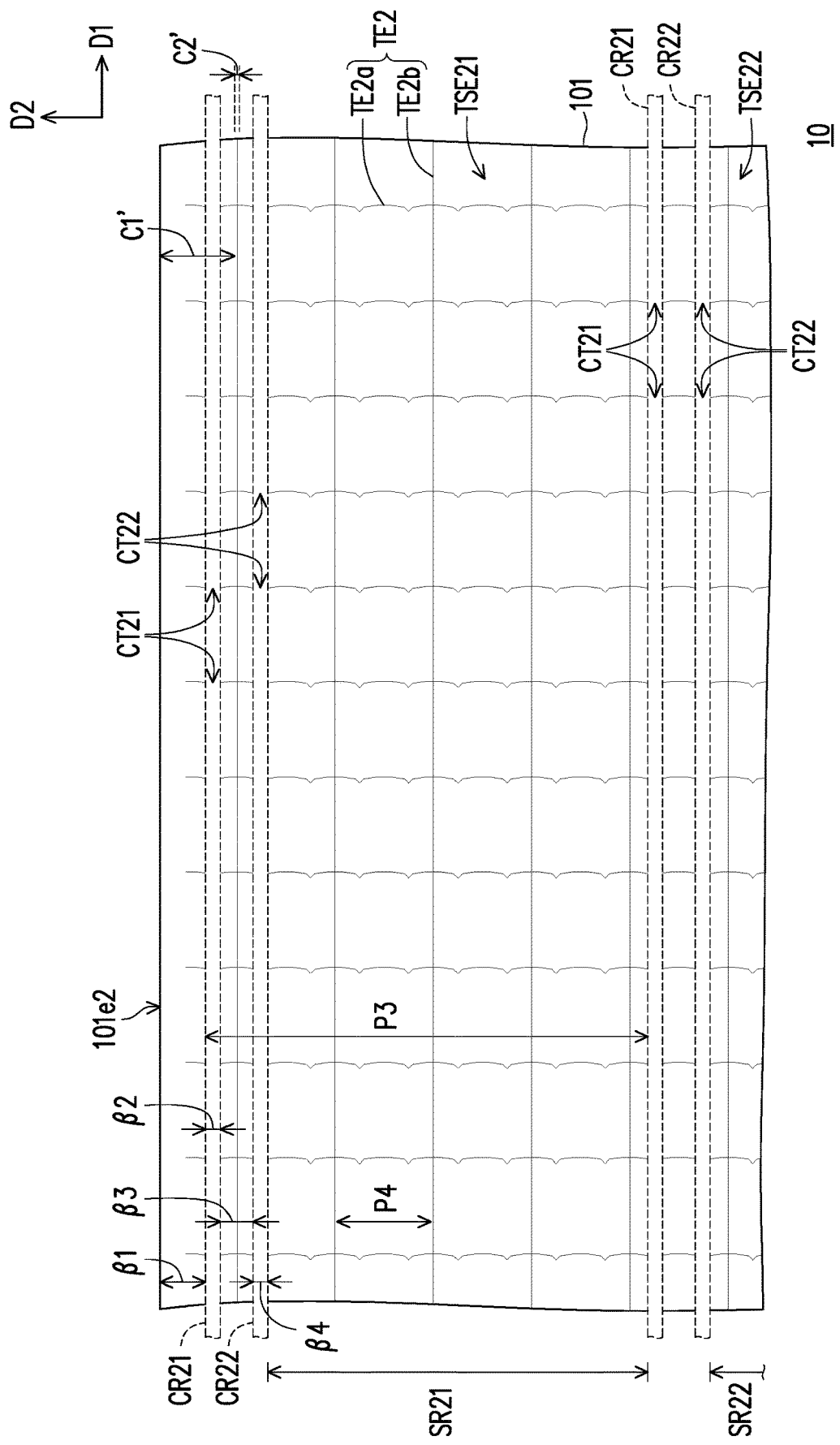
FIG. 4 is a schematic top view of a second mesh electrode in FIG. 1.

FIG. 1 is a schematic cross-sectional view of a touch display panel according to a first embodiment of the disclosure. FIG. 2 is a schematic top view of a touch display panel according to the first embodiment of the disclosure. FIG. 3 is a schematic top view of a first mesh electrode in FIG. 1. FIG. 4 is a schematic top view of a second mesh electrode in FIG. 1. In particular, for clarity, FIG. 2 omits a substrate 102, a display medium layer DM, a color filter pattern 110, a light-shielding pattern layer BM, an insulation layer 121, and an insulation layer 122 in FIG. 1. FIG. 3 shows only a substrate 101, a first mesh electrode TE1, a disconnection region CR11, and a disconnection region CR12 of FIG. 2. FIG. 4 shows only the substrate 101, a second mesh electrode TE2, a disconnection region CR21, and a disconnection region CR22 of FIG. 2.

Referring to FIG. 1 and FIG. 2, a touch display panel 10 includes a touch sensing layer 120 and a display panel 100. The touch sensing layer 120 is disposed on a surface 101s1 of the substrate 101 of the display panel 100. More specifically, the touch display panel 10 of the present embodiment is an on-cell touch display panel. However, the disclosure is not limited thereto. According to other embodiments, the touch sensing layer of the touch display panel may also be disposed on another substrate, and the substrate is directly attached to a surface of a light emitting side of the display panel. In other words, the touch display panel herein is an out-cell touch display panel. In another embodiment, the touch display panel may further be an in-cell touch display panel. In other words, the touch sensing layer may also be integrated into the display panel.

The display panel 100 includes a substrate 101, a substrate 102, a display medium layer DM, a light-shielding pattern layer BM, a plurality of color filter patterns 110, and a plurality of pixel structures PX. The substrate 101 is disposed opposite to the substrate 102. The display medium layer DM is disposed between the substrate 101 and the substrate 102. In the present embodiment, the display medium layer DM includes, for example, a plurality of liquid crystal molecules, but is not limited thereto. In other embodiments, the display medium layer DM may also include a plurality of light emitting structures. In other words, the touch sensing layer 120 of the present embodiment may also be applied to, for example, an organic light emitting diode (OLED) display panel, a micro light emitting diode (micro-LED) display panel, or other self-luminous display panels.

In the present embodiment, the light-shielding pattern layer BM and the color filter pattern 110 are disposed on a surface 101s2 of the substrate 101, but the disclosure is not limited thereto. In other embodiments, at least one of the light-shielding pattern layer BM and the color filter pattern 110 may also be disposed on the substrate 102. In addition, the light-shielding pattern layer BM defines a plurality of pixel regions PXR of the display panel 100, and the plurality of pixel structures PX are respectively disposed in these pixel regions PXR. A plurality of color filter patterns 110 overlap these pixel regions PXR, respectively. For example, the color filter patterns 110 may be used to display red, blue, or green, respectively, but is not limited thereto. In addition, the substrate 102 in the present embodiment is, for example, a pixel array substrate including a driving circuit layer (not shown) and an active device layer (not shown), but is not limited thereto.

Further, the touch sensing layer 120 includes a first mesh electrode TE1, an insulation layer 121, a second mesh electrode TE2, and an insulation layer 122 that are sequentially stacked on the surface 101s1 of the substrate 101 of the display panel 100. In the present embodiment, the first mesh electrode TE1 and the second mesh electrode TE2 may be disposed on different layers, but the disclosure is not limited thereto. Moreover, the first mesh electrode TE1 is misaligned with the second mesh electrode TE2 in a normal direction of the surface 101s1 of the substrate 101. In other words, a vertical projection of the first mesh electrode TE1 on the substrate 101 partially overlaps the second mesh electrode TE2, but the disclosure is not limited thereto. In the present embodiment, the first mesh electrode TE1 is, for example, a sensing electrode (receiving electrode), and the second mesh electrode TE2 is, for example, a driving electrode, but the disclosure is not limited thereto. In other embodiments, the first mesh electrode TE1 may also be a driving electrode, and the second mesh electrode TE2 may also be a sensing electrode. It should be noted that, in the present embodiment, the mesh electrode may completely overlap the light-shielding pattern layer BM in the normal direction of the surface 101s1 of the substrate 101. However, the disclosure is not limited thereto. According to other embodiments, the mesh electrode may partially overlap the light-shielding pattern layer BM.

In detail, the first mesh electrode TE1 has a plurality of first extending portions TE1a and a plurality of second extending portions TE1b. The first extending portions TE1a intersect with the second extending portions TE1b. For example, in the present embodiment, the first extending portions TE1a are arranged along a first direction D1 and extend in a second direction D2, and the second extending portions TE1b are arranged along the second direction D2 and extend in the first direction D1. The first direction D1 may be perpendicular to the second direction D2, but is not limited thereto. In addition, the second mesh electrode TE2 has a plurality of third extending portions TE2a and a plurality of fourth extending portions TE2b, the third extending portions TE2a intersecting with the fourth extending portions TE2b. In the present embodiment, the third extending portions TE2a are alternately arranged with the plurality of first extending portions TE1a in the first direction D1, and extend in the second direction D2. The fourth extending portions TE2b are alternately arranged with the plurality of second extending portions TE1b in the second direction D2, and extend in the first direction D1.

It should be noted that, in order to achieve partition sensing, the mesh electrode further includes a plurality of disconnection regions. In the present embodiment, the first mesh electrode TE1 has a plurality of disconnection regions CR11 and a plurality of disconnection regions CR12. The disconnection regions CR11 and the disconnection regions CR12 overlap the second extending portions TE1b of the first mesh electrode TE1 in the normal direction of the surface 101s1 of the substrate 101, and do not overlap the first extending portions TE1a. In other words, the disconnection regions CR11 and the disconnection regions CR12 are located between the plurality of first extending portions TE1a, and the second extending portions TE1b of the first mesh electrode TE1 has a disconnected position CT11 and a disconnected position CT12 respectively overlapping the disconnection region CR11 and the disconnection region CR12. Similarly, the second mesh electrode TE2 has a plurality of disconnection regions CR21 and a plurality of disconnection regions CR22. The disconnection region CR21 and the disconnection region CR22 overlap the third extending portion TE2a of the second mesh electrode TE2 in the normal direction of the surface 101s1 of the substrate 101, and do not overlap the fourth extending portion TE2b. In other words, the disconnection regions CR21 and the disconnection regions CR22 are located between the plurality of fourth extending portions TE2b, and the third extending portions TE2a of the second mesh electrode TE2 has a disconnected position CT21 and a disconnected position CT22 respectively overlapping the disconnection region CR21 and the disconnection region CR22.

Referring to FIG. 2 and FIG. 3, further, the plurality of disconnection regions CR11 and the plurality of disconnection regions CR12 of the first mesh electrode TE1 are alternately arranged in the first direction D1. A disconnection region CR11 and a disconnection region CR12 adjacent to each other may form a disconnection region group, and these disconnection region groups are arranged on the substrate 101 in a period P1. In other words, the plurality of disconnection regions CR11 or the plurality of disconnection regions CR12 are arranged on the substrate 101 in the period P1. It should be noted that the disclosure does not limit the number of disconnection regions of each disconnection region group. In other embodiments, at least one of disconnection region group may also include one disconnection region, for example, include only the disconnection region CR11. In the present embodiment, these disconnection region groups are arranged along the first direction D1 and define a plurality of sensing regions (for example, sensing regions SR11 and sensing regions SR12) of the touch display panel 10. The plurality of second extending portions TE1b overlap the plurality of disconnected positions (for example, the disconnected position CT11 and the disconnected position CT12) of these disconnection region groups, so that the first mesh electrode TE1 may be separated into a plurality of first sub-electrodes, and the first sub-electrodes are respectively located in the plurality of sensing regions. For example, a first sub-electrode TSE11 and a first sub-electrode TSE12 are located in the sensing region SR11 and the sensing region SR12, respectively.

It should be noted that, in the present embodiment, the plurality of first extending portions TE1a of the first mesh electrode TE1 are arranged on the substrate 101 in a period P2, the period P1 being not an integer multiple of the period P2, but the disclosure is not limited thereto. In other words, since the arrangement period P1 of the plurality of disconnection regions CR11 (or the plurality of disconnection regions CR12) is a non-integer multiple of the arrangement period P2 of the plurality of first extending portions TE1a, the disconnection region CR11 and the disconnection region CR12 closest to a side edge 101e1 of the substrate 101 are respectively located on opposite sides of the first extending portion TE1a closest to the side edge 101e1 of the substrate 101, while the disconnection region CR11 and the disconnection region CR12 second close to the side edge 101e1 of the substrate 101 are located between the two adjacent first extending portions TE1a.

In detail, the substrate 101 has the side edge 101e1 parallel to the first extending portion TE1a. There is a shortest distance α1 between the plurality of disconnection regions CR11 and the side edge 101e1 of the substrate 101 in the first direction D1, and at least one of these disconnection regions CR11 has a width α2 in the first direction D1. A distance α3 exists between the adjacent disconnection regions CR11 and disconnection regions CR12 in the first direction D1. At least one of these disconnection regions CR12 has a width α4 in the first direction D1. In the present embodiment, the width α2 and the width α4 may be a same width, but is not limited thereto. In other embodiments, the width α2 and the width α4 may be different widths. The plurality of disconnection regions CR11 are respectively located within a coordinate range of [(n−1) P1+α1] to [(n−1) P1+α1+α2] based on the side edge 101e1, n being a positive integer. The plurality of disconnection regions CR12 are respectively located within a coordinate range of [(n−1) P1+α1+α2+α3] to [(n−1) P1+α1+α2+α3+α4] based on the side edge 101e1. In addition, a shortest distance C1 exists between the plurality of first extending portions TE1a and the side edge 101e1 in the first direction D1, and at least one of vertical projections of the first extending portions TE1a on the second extending portions TE1b has a width C2. The plurality of first extending portions TE1a are respectively located within a coordinate range of [(m−1) P2+C1] to [(m−1) P2+C1+C2] based on the side edge 101e1, m being a positive integer.

It should be noted that the coordinate range of [(n−1) P1+α1] to [(n−1) P1+α1+α2] of the plurality of disconnection regions CR11 and the coordinate range of [(n−1) P1+α1+α2+α3] to [(n−1) P1+α1+α2+α3+α4] of the plurality of disconnection regions CR12 do not overlap the coordinate range of [(m−1) P2+C1] to [(m−1) P2+C1+C2] of the plurality of first extending portions TE1a, so that the visibility of the disconnection region CR11 (or the disconnected position CT11) and the disconnection region CR12 (or the disconnected position CT12) of the first mesh electrode TE1 may be reduced, thereby helping improve the display quality of the touch display panel 10.

Referring to FIG. 2 and FIG. 4, the plurality of disconnection regions CR21 and the plurality of disconnection regions CR22 of the second mesh electrode TE2 are alternately arranged in the second direction D2. A disconnection region CR21 and a disconnection region CR22 adjacent to each other may form a disconnection region group, and these disconnection region groups are arranged on the substrate 101 in a period P3. In other words, the plurality of disconnection regions CR21 (or the plurality of disconnection regions CR22) are arranged on the substrate 101 in the period P3. It should be noted that the disclosure does not limit the number of disconnection regions of each disconnection region group. In other embodiments, at least one of disconnection region groups may also include one disconnection region, for example, include only the disconnection region CR21. In the present embodiment, these disconnection region groups are arranged along the second direction D2 and define a plurality of sensing regions (for example, sensing regions SR21 and sensing regions SR22) of the touch display panel 10. The plurality of third extending portions TE2a overlap the plurality of disconnected positions (for example, the disconnected position CT21 and the disconnected position CT22) of these disconnection region groups, so that the second mesh electrode TE2 may be separated into a plurality of second sub-electrodes, and the second sub-electrodes are respectively located in the plurality of sensing regions. For example, a second sub-electrode TSE21 and a second sub-electrode TSE22 are located in the sensing region SR21 and the sensing region SR22, respectively.

It should be noted that, in the present embodiment, the plurality of fourth extending portions TE2b of the second mesh electrode TE2 are arranged on the substrate 101 in a period P4, the period P3 being not an integer multiple of the period P4, but the disclosure is not limited thereto. In other words, since the arrangement period P3 of the plurality of disconnection regions CR21 (or the plurality of disconnection regions CR22) is a non-integer multiple of the arrangement period P4 of the plurality of fourth extending portions TE2b, the disconnection region CR21 and the disconnection region CR22 closest to a side edge 101e2 of the substrate 101 are respectively located on opposite sides of the fourth extending portion TE2b closest to the side edge 101e2 of the substrate 101, while the disconnection region CR21 and the disconnection region CR22 second close to the side edge 101e2 of the substrate 101 are located between the two adjacent fourth extending portions TE2b.

In detail, the substrate 101 further has the side edge 101e2 parallel to the fourth extending portion TE2b. There is a shortest distance β1 between the plurality of disconnection regions CR21 and the side edge 101e2 of the substrate 101 in the second direction D2, and at least one of these disconnection regions CR21 has a width β2 in the second direction D2. A distance β3 exists between the adjacent disconnection regions CR21 and disconnection regions CR22 in the second direction D2. At least one of these disconnection regions CR22 has a width β4 in the second direction D2. In the present embodiment, the width β2 and the width β4 may have a same width, but is not limited thereto. In other embodiments, the width β2 and the width β4 may also have different widths. The plurality of disconnection regions CR21 are respectively located within a coordinate range of [(t−1) P3+β1] to [(t−1) P3+β1+β2] based on the side edge 101e2, t being a positive integer. The plurality of disconnection regions CR22 are respectively located within a coordinate range of [(t−1) P3+β1+β2+β3] to [(t−1) P3+β1+β2+β3+β4] based on the side edge 101e2. In addition, a shortest distance C1' exists between the plurality of fourth extending portions TE2b and the side edge 101e2 in the second direction D2, and at least one of vertical projections of the fourth extending portions TE2b on the third extending portions TE2a has a width C2'. The plurality of fourth extending portions TE2b are respectively located within a coordinate range of [(s−1) P4+C1'] to [(s−1) P4+C1'+C2'] based on the side edge 101e2, s being a positive integer.

It should be noted that the coordinate range of [(t−1) P3+β1] to [(t−1) P3+β1+β2] of the plurality of disconnection regions CR21 and the coordinate range of [(t−1) P3+β1+β2+β3] to [(t−1) P3+β1+β2+β3+β4] of the plurality of disconnection regions CR22 do not overlap the coordinate range of [(s−1) P4+C1'] to [(s−1) P4+C1'+C2'] of the plurality of fourth extending portions TE2b, so that the visibility of the disconnection regions CR21 (or the disconnected position CT21) and the disconnection region CR22 (or the disconnected position CT22) of the second mesh electrode TE2 may be reduced, thereby helping improve the display quality of the touch display panel 10.

Some other embodiments are listed below to describe the disclosure in detail. The same components are marked with a same symbol, and the descriptions of the same technical content are omitted. For the omitted parts, refer to the foregoing embodiments, and the descriptions thereof are omitted herein.

Figure 5:
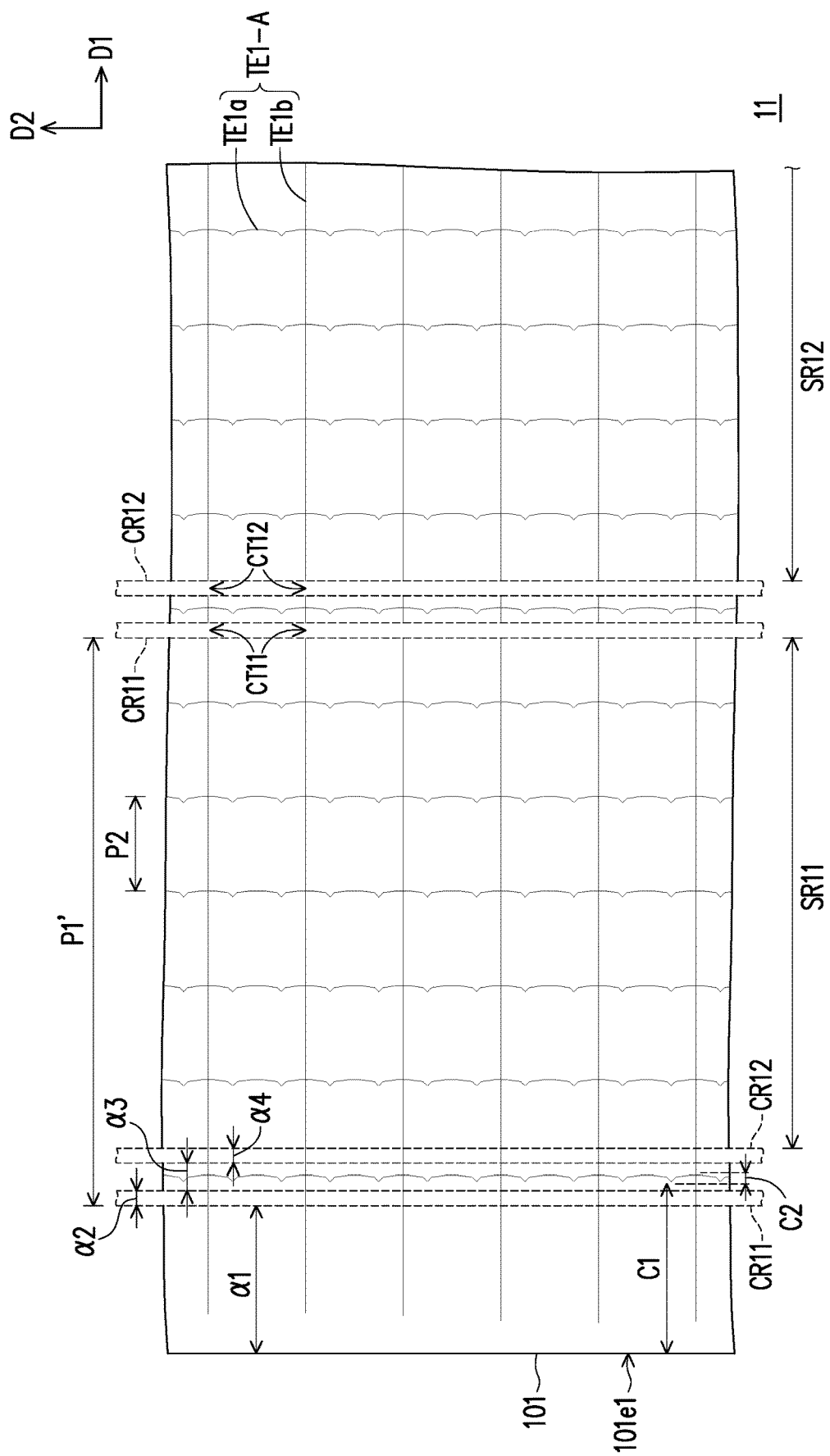
FIG. 5 is a schematic top view of a first mesh electrode according to a second embodiment of the disclosure.
Figure 6:
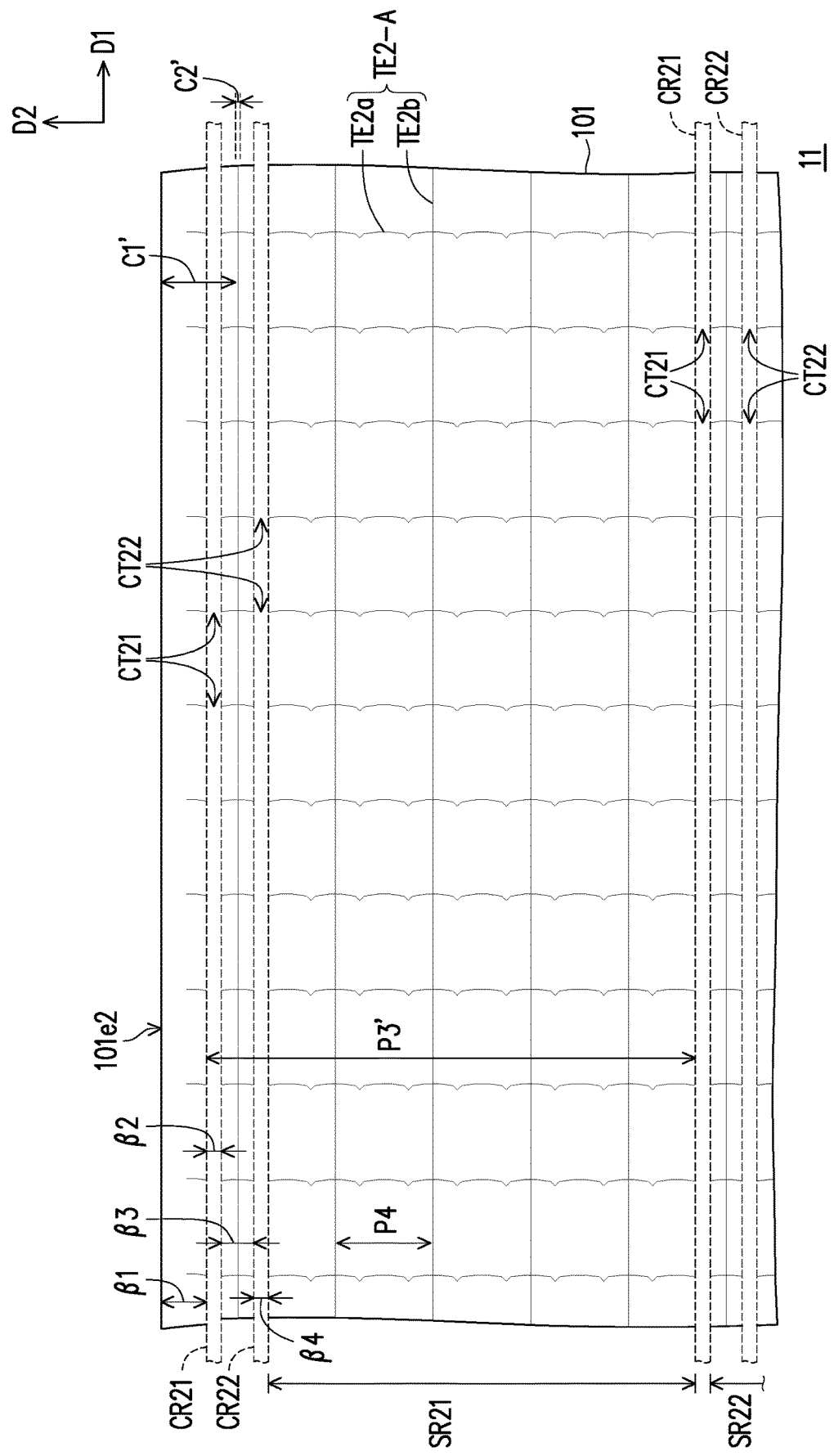
FIG. 6 is a schematic top view of a second mesh electrode according to the second embodiment of the disclosure.

FIG. 5 is a schematic top view of a first mesh electrode according to a second embodiment of the disclosure. FIG. 6 is a schematic top view of a second mesh electrode according to the second embodiment of the disclosure. Referring to FIG. 5 and FIG. 6, a difference between a touch display panel 11 of the present embodiment and the touch display panel 10 in FIG. 3 and FIG. 4 lies in that: an arrangement period of a disconnection region of a first mesh electrode is different from an arrangement period of a disconnection region of a second mesh electrode.

In the present embodiment, a plurality of disconnection regions CR11 (or disconnection regions CR12) of the first mesh electrode TE1-A are arranged on a substrate 101 in a period P1', and a plurality of first extending portions TE1a are arranged on the substrate 101 in a period P2, the period P1' being an integer multiple of the period P2. In other words, since the arrangement period P1' of the plurality of disconnection regions CR11 (or the plurality of disconnection regions CR12) is an integer multiple of the arrangement period P2 of the plurality of first extending portions TE1a, the disconnection region CR11 and the disconnection region CR12 closest to a side edge 101e1 of the substrate 101 are respectively located on opposite sides of the first extending portions TE1a closest to the side edge 101e1 of the substrate 101, while the disconnection region CR11 and the disconnection region CR12 second close to the side edge 101e1 of the substrate 101 are also located on opposite sides of the adjacent first extending portions TE1a.

For example, the plurality of disconnection regions CR11 are respectively located within a coordinate range of [(n−1) P1'+α1] to [(n−1) P1'+α1+α2] based on the side edge 101e1, and the plurality of disconnection regions CR12 are respectively located within a coordinate range of [(n−1) P1'+α1+α2+α3] to [(n−1) P1'+α1+α2+α3+α4] based on the side edge 101e1, n being a positive integer. The plurality of first extending portions TE1a are respectively located within a coordinate range of [(m−1) P2+C1] to [(m−1) P2+C1+C2 based] on the side edge 101e1, m being a positive integer. The coordinate range of [(n−1) P1'+α1] to [(n−1) P1'+α1+α2] of the plurality of disconnection regions CR11 and the coordinate range of [(n−1) P1'+α1+α2+α3] to [(n−1) P1'+α1+α2+α3+α4] of the plurality of disconnection regions CR12 do not overlap the coordinate range of [(m−1) P2+C1] to [(m−1) P2+C1+C2] of the plurality of first extending portions TE1a, so that the visibility of the disconnection regions CR11 (or the disconnected position CT11) and the disconnection regions CR12 (or the disconnected position CT12) of the first mesh electrode TE1-A may be reduced, thereby helping improve the display quality of the touch display panel 11.

In addition, a plurality of disconnection regions CR21 (or disconnection regions CR22) of the second mesh electrode TE2-A are arranged on the substrate 101 in a period P3', and the plurality of fourth extending portions TE2b are arranged on the substrate 101 in a period P4, the period P3' being an integer multiple of the period P4. In other words, since the arrangement period P3' of the plurality of disconnection regions CR21 (or the plurality of disconnection regions CR22) is an integer multiple of the arrangement period P4 of the plurality of fourth extending portions TE2b, the disconnection region CR21 and the disconnection region CR22 closest to a side edge 101e2 of the substrate 101 are respectively located on opposite sides of the fourth extending portions TE2b closest to the side edge 101e2 of the substrate 101, while the disconnection regions CR21 and the disconnection regions CR22 second close to the side edge 101e2 of the substrate 101 are also located on opposite sides of the adjacent fourth extending portions TE2b.

For example, the plurality of disconnection regions CR21 are respectively located within a coordinate range of [(t−1) P3'+β1] to [(t−1) P3'+β1+β2] based on the side edge 101e2, and the plurality of disconnection regions CR22 are respectively located within a coordinate range of [(t−1) P3'+β1+β2+β3] to [(t−1) P3'+β1+β2+β3+β4] based on the side edge 101e2, t being a positive integer. The plurality of fourth extending portions TE2b are respectively located within a coordinate range of [(s−1) P4+C1'] to [(s−1) P4+C1'+C2'] based on the side edge 101e2, s being a positive integer. The coordinate range of [(t−1) P3'+β1] to [(t−1) P3'+β1+β2] of the plurality of disconnection regions CR21 and the coordinate range of [(t−1) P3'+β1+β2+β3] to [(t−1) P3'+β1+β2+β3+β4] of the plurality of disconnection regions CR22 do not overlap the coordinate range of [(s−1) P4+C1'] to [(s−1) P4+C1'+C2'] of the plurality of fourth extending portions TE2b, so that the visibility of the disconnection regions CR21 (or the disconnected position CT21) and the disconnection region CR22 (or the disconnected position CT22) of the second mesh electrode TE2-A may be reduced, thereby helping improve the display quality of the touch display panel 11.

Figure 7:
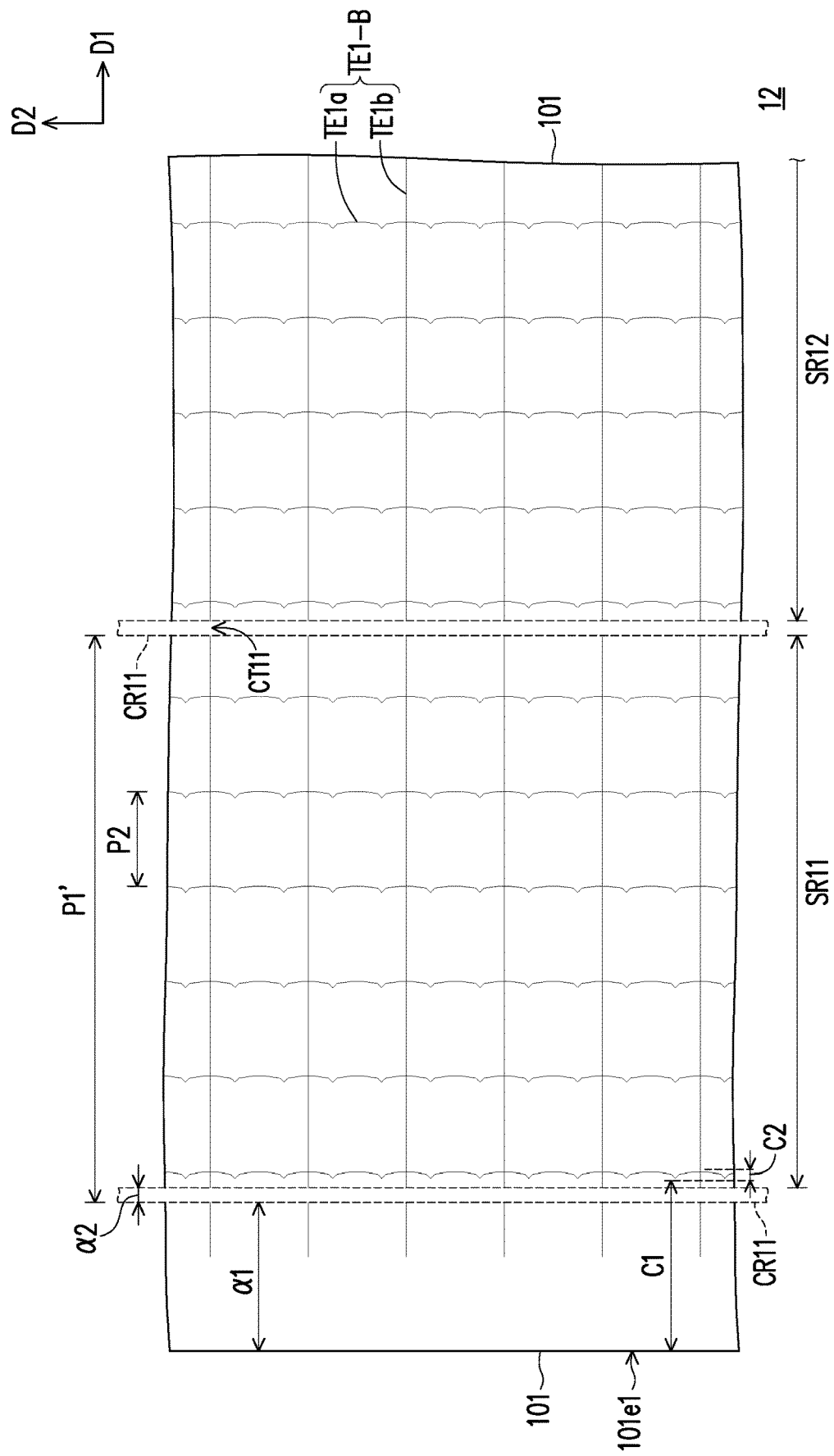
FIG. 7 is a schematic top view of a first mesh electrode according to a third embodiment of the disclosure.
Figure 8:
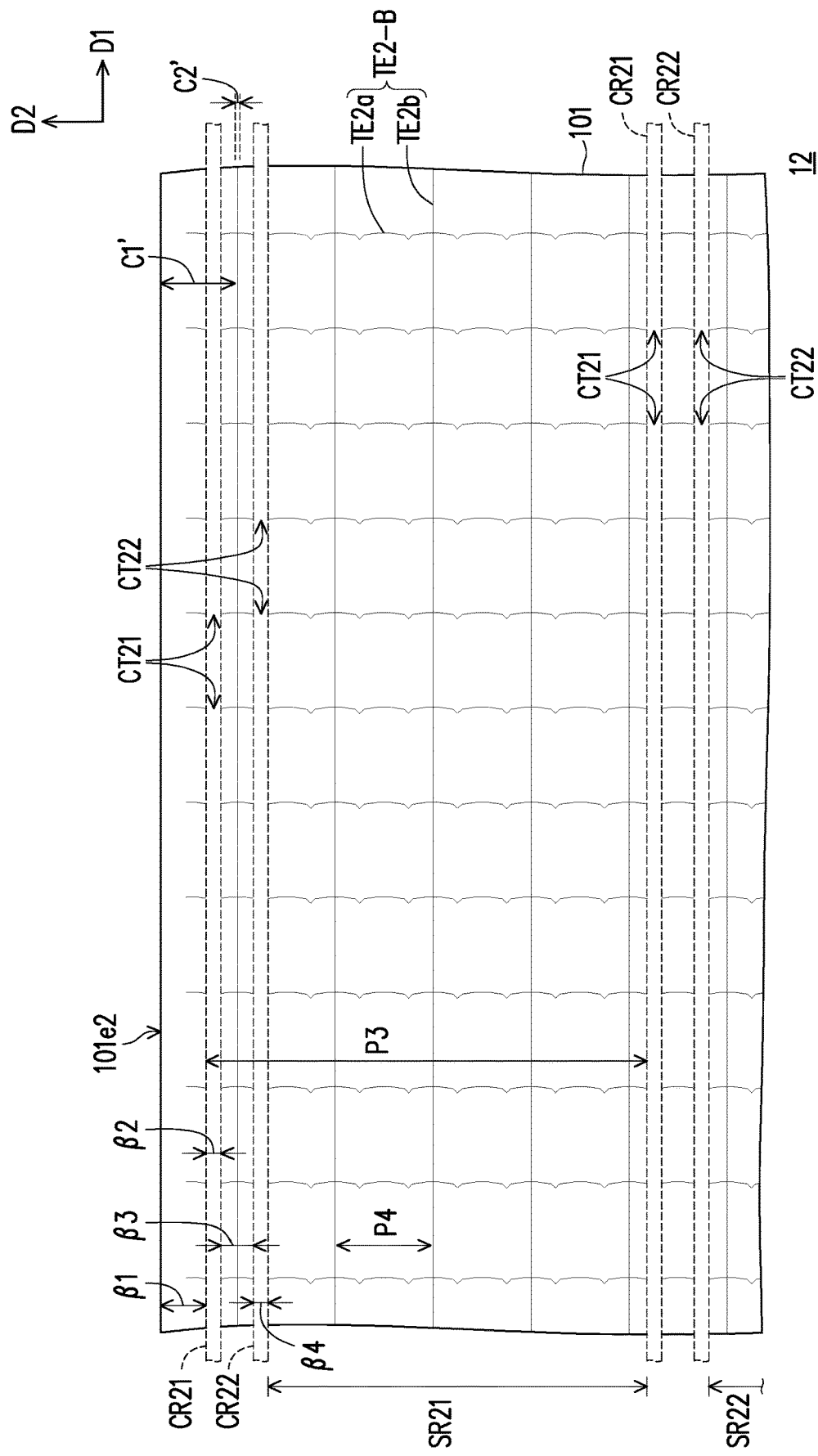
FIG. 8 is a schematic top view of a second mesh electrode according to the third embodiment of the disclosure.

FIG. 7 is a schematic top view of a first mesh electrode according to a third embodiment of the disclosure. FIG. 8 is a schematic top view of a second mesh electrode according to the third embodiment of the disclosure. Referring to FIG. 7 and FIG. 8, a difference between a touch display panel 12 of the present embodiment and the touch display panel 10 in FIG. 3 and FIG. 4 lies in that: an arrangement period of a plurality of disconnection regions of a first mesh electrode and a quantity thereof are different. It should be noted that, since the second mesh electrode TE2-B of the present embodiment is similar to the second mesh electrode TE2 of FIG. 4, reference is made to the relevant paragraphs of the foregoing embodiments for detailed description, and the descriptions thereof are omitted herein.

Specifically, there is one disconnection region (for example, the disconnection region CR11) of each disconnection region group of a first mesh electrode TE1-B of the touch display panel 12, and these disconnection region CR11 are arranged on a substrate 101 in a period P1'. It should be noted that, a plurality of first extending portions TE1a are arranged on the substrate 101 in a period P2, the period P1' being an integer multiple of the period P2. In other words, since the arrangement period P1' of the plurality of disconnection regions CR11 is an integer multiple of the arrangement period P2 of the plurality of first extending portions TE1a, an arrangement relationship between the disconnection region CR11 closest to the side edge 101e1 of the substrate 101 and the closest first extending portion TE1a is the same as an arrangement relationship between the disconnection region CR11 second close to the side edge 101e1 of the substrate 101 and the closest first extending portion TE1a.

For example, the plurality of disconnection regions CR11 are respectively located within a coordinate range of [(n−1) P1'+α1] to [(n−1) P1'+α1+α2] based on the side edge 101e1, n being a positive integer. The plurality of first extending portions TE1a are respectively located within a coordinate range of [(m−1) P2+C1] to [(m−1) P2+C1+C2] based on the side edge 101e1, m being a positive integer. The coordinate range of [(n−1) P1'+α1] to [(n−1) P1'+α1+α2] of the plurality of disconnection regions CR11 does not overlap the coordinate range of [(m−1) P2+C1] to [(m−1) P2+C1+C2] of the plurality of first extending portions TE1a, so that the visibility of the disconnection regions CR11 (or the disconnected position CT11) of the first mesh electrode TE1-B may be reduced, thereby helping improve the display quality of the touch display panel 12.

It should be noted that in the present embodiment, there is one disconnection region (for example, the disconnection region CR11) in each disconnection region group of the first mesh electrode TE1-B, and there are two disconnection regions (for example, the disconnection region CR21 and the disconnection region CR22) in each disconnection region group of the second mesh electrode TE2-B, which is not limited thereto. In other embodiments, the number of respective disconnection regions (or the number of disconnection regions in each disconnection region group) and the configuration period of the first mesh electrode and the second mesh electrode may be different from each other depending on actual design requirements. In this way, the design margin of the touch display panel may be increased.

Figure 9:
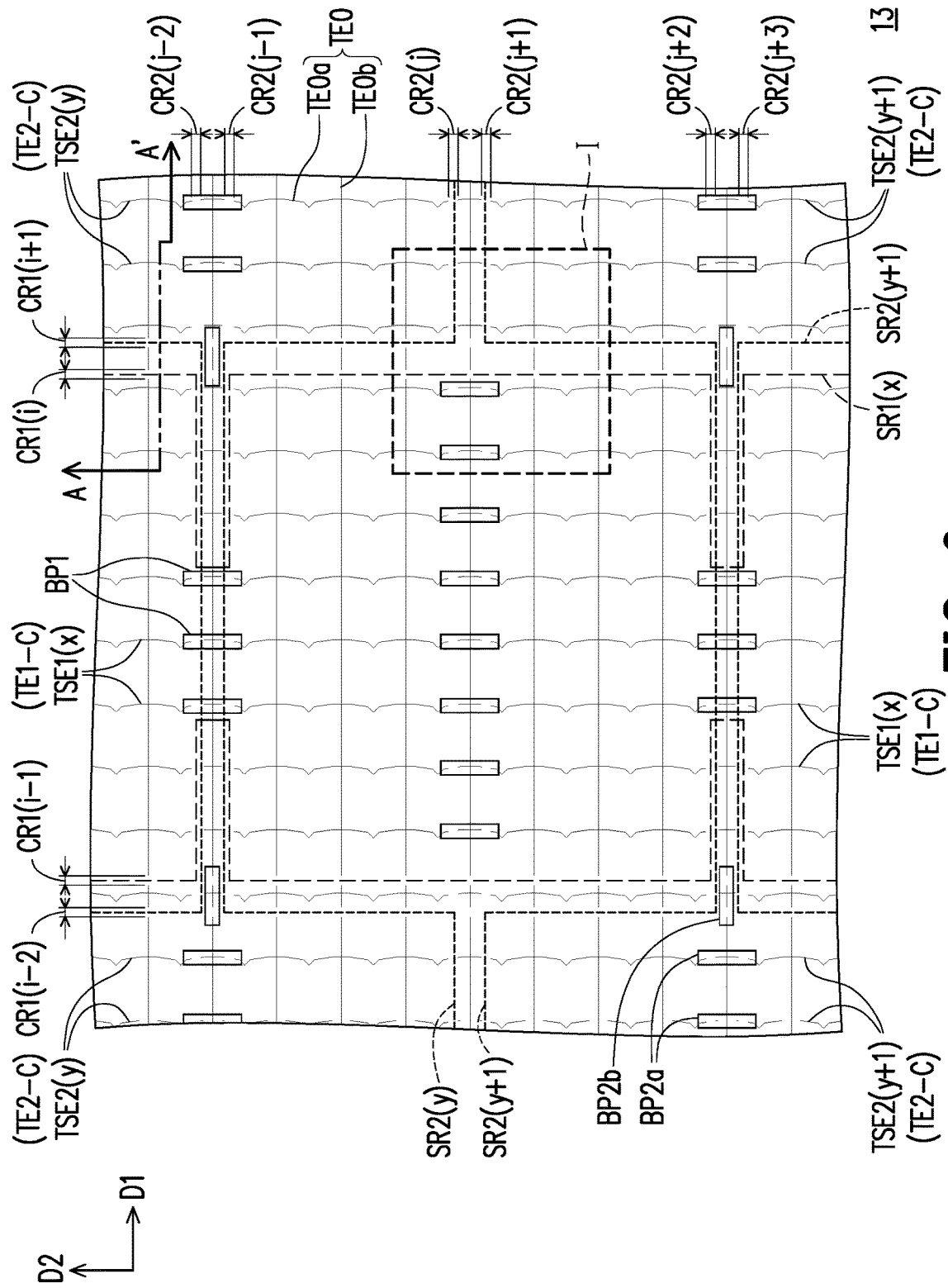
FIG. 9 is a schematic top view of a touch display panel according to a fourth embodiment of the disclosure.
Figure 10:
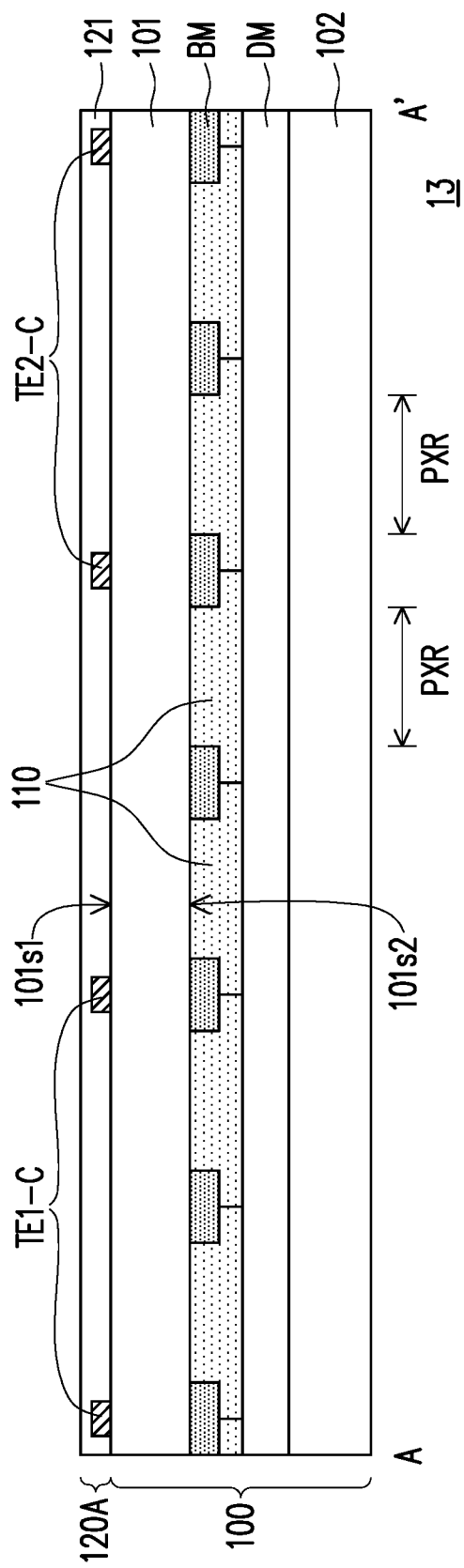
FIG. 10 is a schematic cross-sectional view of the touch display panel in FIG. 9.
Figure 11:
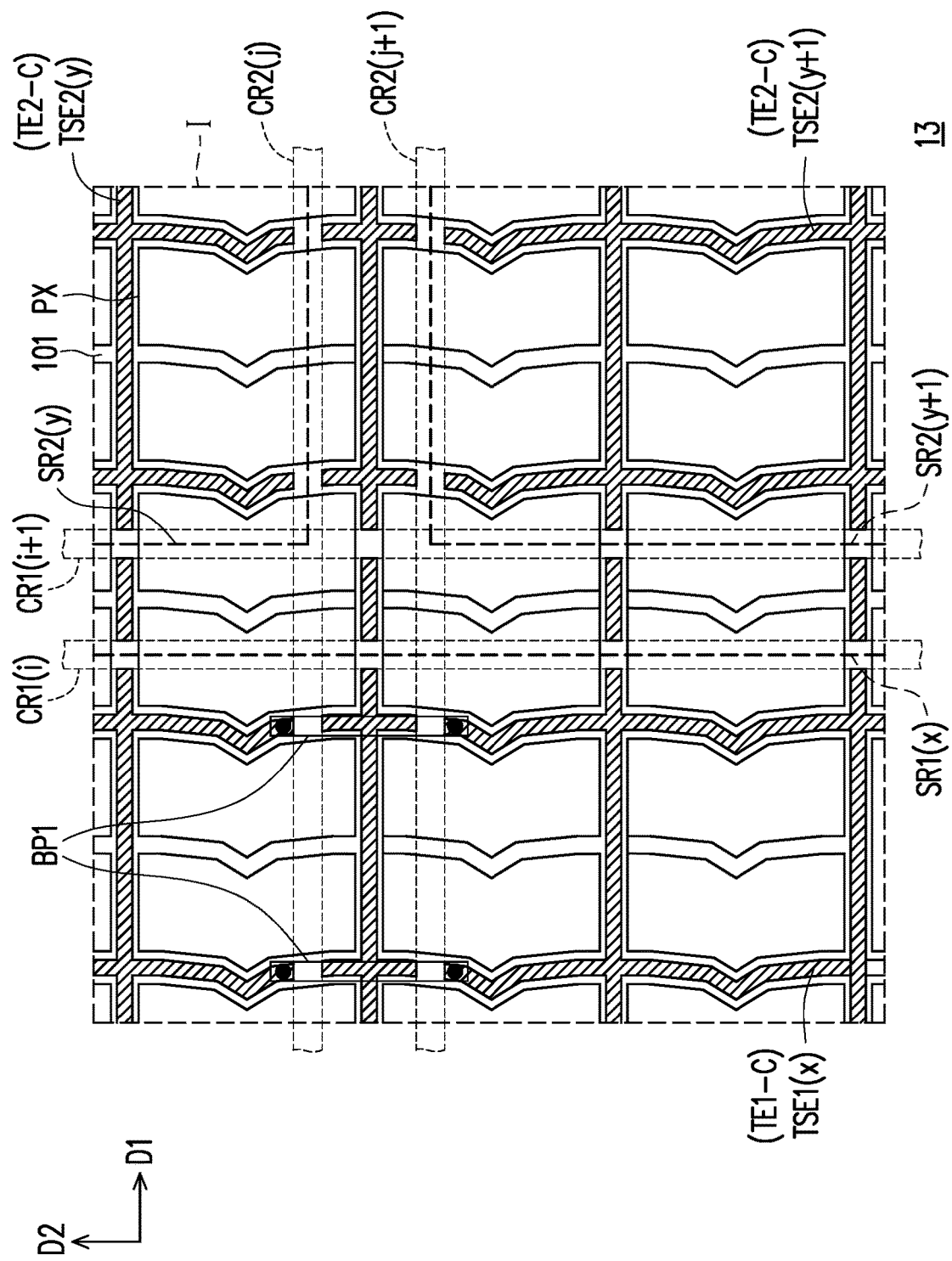
FIG. 11 is a schematic enlarged view of a partial region of the touch display panel in FIG. 9.

FIG. 9 is a schematic top view of a touch display panel according to a fourth embodiment of the disclosure. FIG. 10 is a schematic cross-sectional view of the touch display panel in FIG. 9. FIG. 11 is a schematic enlarged view of a partial region of the touch display panel in FIG. 9. FIG. 10 corresponds to the section line A-A' of FIG. 9. FIG. 11 corresponds to a region I of FIG. 9. In particular, for clarity, FIG. 9 and FIG. 11 omit a substrate 102, a display medium layer DM, a color filter pattern 110, a light-shielding pattern layer BM, and an insulation layer 121 in FIG. 10.

Referring to FIG. 9, FIG. 10, and FIG. 11, a main difference between a touch display panel 13 of the present embodiment and the touch display panel 10 in FIG. 1 and FIG. 2 lies in that: a mesh electrode is configured in different ways. Specifically, a first mesh electrode TE1-C and a second mesh electrode TE2-C of a touch sensing layer 120A of the touch display panel 13 are disposed on a same layer, and the layer is located between the substrate 101 and the insulation layer 121. In the present embodiment, the first mesh electrode TE1-C and the second mesh electrode TE2-C may be cut from the same mesh electrode TE0. For example, the mesh electrode TE0 has a plurality of extending portions TE0a and a plurality of extending portions TE0b. The plurality of extending portions TE0a are arranged along a first direction D1 and extend in a second direction D2, and the plurality of extending portions TE0b are arranged along the second direction D2 and extend in the first direction D1. However, the disclosure is not limited thereto. In other embodiments, the first mesh electrode and the second mesh electrode may also be disposed on different layers.

In order to form the first mesh electrode TE1-C and the second mesh electrode TE2-C, the mesh electrode TE0 also has a plurality of disconnection regions, for example, a disconnection region CR1 (i−2), a disconnection region CR1 (i−1), a disconnection region CR1 (i), a disconnection region CR1 (i+1), a disconnection region CR2 (j−2), a disconnection region CR2 (j−1), a disconnection region CR2 (j), a disconnection region CR2 (j+1), a disconnection region CR2 (j+2), and a disconnection region CR2 (j+3), where i and j are positive integers. For example, the disconnection region CR1 (i−2), the disconnection region CR1 (i−1), the disconnection region CR1 (i), and the disconnection region CR1 (i+1) are arranged along the first direction D1 and extend in the second direction D2. The disconnection region CR2 (j−2), the disconnection region CR2 (j−1), the disconnection region CR2 (j), the disconnection region CR2 (j+1), the disconnection region CR2 (j+2), and the disconnection region CR2 (j+3) are arranged along the second direction D2 and extend in the first direction D1. These disconnection regions may define a plurality of sensing regions of the touch display panel 13, for example, a sensing region SR1 (x), a sensing region SR2 (y), and a sensing region SR2 (y+1), where x and y are positive integers. The first mesh electrode TE1-C is located in the sensing region SR1(x), and the second mesh electrode TE2-C is located in the sensing region SR2 (y) and the sensing region SR2 (y+1).

It should be noted that, in the present embodiment, the disconnection region CR1 (i−2), the disconnection region CR1 (i−1), the disconnection region CR1 (i), and the disconnection region CR1 (i+1) overlap the plurality of extending portions TE0b of the mesh electrode TE0 and do not overlap the plurality of extending portions TE0a. The disconnection region CR2 (j−2), the disconnection region CR2 (j−1), the disconnection region CR2 (j), the disconnection region CR2 (j+1), the disconnection region CR2 (j+2), and the disconnection region CR2 (j+3) overlap the plurality of extending portions TE0a of the mesh electrode TE0 and do not overlap the plurality of extending portions TE0b. Accordingly, visibility of the disconnection regions of the mesh electrode TE0 can be reduced, and the display quality of the touch display panel 13 can be improved.

Further, the mesh electrode TE0 can be caused, through the plurality of disconnection regions, to form a first mesh electrode TE1-C including a plurality of first sub-electrodes separated from each other and a second mesh electrode TE2-C including a plurality of second sub-electrodes separated from each other. These first sub-electrodes of the first mesh electrode TE1-C, for example, the first sub-electrode TSE1(x), are arranged along the first direction D1 and extend in the second direction D2. These second sub-electrodes of the second mesh electrode TE2-C, for example, the second sub-electrode TSE2 (y) and the second sub-electrode TSE2 (y+1) located in the sensing region SR2 (y) and the sensing region SR2 (y+1), respectively, are arranged along the second direction D2 and extend in the first direction D1.

In particular, the first mesh electrode TE1-C may have a plurality of bridging patterns BP1. The bridging patterns BP1 overlap the disconnection region CR2 (j−2), the disconnection region CR2 (j−1), the disconnection region CR2 (j), the disconnection region CR2 (j+1), the disconnection region CR2 (j+2), and the disconnection region CR2 (j+3) of the mesh electrode TE0 in the normal direction of a surface 101s1 of the substrate 101, and are each electrically connected to two extending segments TE0a on opposite sides of the disconnection region group (for example, the disconnection region CR2 (j) and the disconnection region CR2 (j+1)). In addition, the second mesh electrode TE2-C may have a plurality of bridging patterns BP2a and a plurality of bridging patterns BP2b. These bridging patterns BP2a overlap the disconnection region CR2 (j−2), the disconnection region CR2 (j−1), the disconnection region CR2 (j+2), and the disconnection region CR2 (j+3) of the mesh electrode TE0 in the normal direction of the surface 101s1 of the substrate 101, and are each electrically connected to two extending segments TE0a on opposite sides of the disconnection region group (for example, the disconnection region CR2 (j−2) and the disconnection region CR2 (j−1)). These bridging patterns BP2b overlap the disconnection region CR1(i−2), the disconnection region CR1(i−1), the disconnection region CR1(i), and the disconnection region CR1(i+1) of the mesh electrode TE0 in the normal direction of the surface 101s1 of the substrate 101, and are electrically connected to two extending segments TE0b on opposite sides of the disconnection region group (for example, the disconnection region CR1(i−2) and the disconnection region CR1(i−1)).

It should be noted that in the present embodiment, three bridging patterns BP1 of the first mesh electrode TE1-C overlapping the disconnection region CR2 (j−2) and the disconnection region CR2 (j−1) are used as an example for exemplary description, which indicates that the disclosure is not limited thereto. In other embodiments, the number of the bridging patterns BP1 of the first mesh electrode TE1-C overlapping the disconnection region CR2 (j−2) and the disconnection region CR2 (j−1) may also be adjusted depending on actual design requirements (the overall resistance or a size of a sensing capacitor), for example, adjusted to five or seven.

In addition, in the present embodiment, one bridging pattern BP2b of the second mesh electrode TE2-C overlapping the disconnection region CR1 (i) is used as an example for exemplary description, which indicates that the disclosure is not limited thereto. In other embodiments, the number of the bridging patterns BP2b of the second mesh electrode TE2-C overlapping the disconnection region CR1 (i) may also be adjusted depending on actual design requirements (the overall resistance or a size of a sensing capacitor), for example, adjusted to more than two. It may be understood that the number of the bridging patterns BP2a of the second mesh electrode TE2-C overlapping the disconnection region CR2 (j) may also be adjusted depending on actual design requirements (the overall resistance or a size of a sensing capacitor), and the disclosure is not limited by the content disclosed by the accompanying drawing.

Based on the above, in the touch display panel according to an embodiment of the disclosure, the mesh electrode has a plurality of first extending portions and a plurality of second extending portions, the first extending portions intersecting with the second extending portions. In order to achieve partition sensing, the mesh electrode further includes a plurality of disconnection regions. The disconnection regions are caused to overlap the second extending portions and not to overlap the first extending portions, so that visibility of the disconnection regions of the mesh electrode can be reduced, and the display quality of the touch display panel can be improved.

Finally, it should be noted that the foregoing embodiments are merely used for describing the technical solutions of the disclosure, but are not intended to limit the disclosure. Although the disclosure is described in detail with reference to the foregoing embodiments, a person of ordinary skill in the art should understand that, modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

What is claimed is:

1. A touch display panel, comprising:
a substrate; and
a first mesh electrode disposed on the substrate and comprising:
  a plurality of first extending portions arranged along a first direction and extending in a second direction, wherein the first direction intersects with the second direction;
  a plurality of second extending portions arranged along the second direction and extending in the first direction;
  a plurality of first disconnection regions arranged along the first direction and extending in the second direction, wherein the plurality of first disconnection regions overlap the plurality of second extending portions and do not overlap the plurality of first extending portions; and
a second mesh electrode disposed on the substrate and comprising:
  a plurality of third extending portions alternately arranged with the plurality of first extending portions in the first direction;
  a plurality of fourth extending portions alternately arranged with the plurality of second extending portions in the second direction; and
  a plurality of second disconnection regions arranged along the second direction and extending in the first direction, wherein the plurality of second disconnection regions overlap the plurality of third extending portions and do not overlap the plurality of fourth extending portions.

2. The touch display panel according to claim 1, wherein the plurality of second disconnection regions are arranged on the substrate in a period P3, and the plurality of fourth extending portions are arranged on the substrate in a period P4, the period P3 being not an integer multiple of the period P4.

3. The touch display panel according to claim 1, wherein the substrate further comprises a side edge parallel to the fourth extending portion, a shortest distance β1 existing between the plurality of second disconnection regions and the side edge, at least one of the plurality of second disconnection regions having a width β2, and the plurality of second disconnection regions being arranged on the substrate in a period P3, and
a shortest distance C1' existing between the plurality of fourth extending portions and the side edge, at least one of vertical projections of the plurality of fourth extending portions on the third extending portions having a width C2', and the plurality of fourth extending portions being arranged on the substrate in a period P4,
wherein the plurality of second disconnection regions are respectively located within a coordinate range of [(t−1) P3+β1] to [(t−1) P3+β1+β2] based on the side edge, and the plurality of fourth extending portions are respectively located within a coordinate range of [(s−1) P4+C1'] to [(s−1) P4+C1'+C2'] based on the side edge, the coordinate range of [(t−1) P3+β1] to [(t−1) P3+β1+β2] not overlapping the coordinate range of [(s−1) P4+C1'] to [(s−1) P4+C1'+C2'], wherein s and t are positive integers.

4. The touch display panel according to claim 1, wherein the second mesh electrode further comprises a plurality of third disconnection regions alternately arranged with the plurality of second disconnection regions in the second direction, the plurality of third disconnection regions overlap the plurality of third extending portions and not overlap the plurality of fourth extending portions.

5. The touch display panel according to claim 4, wherein the substrate further comprises a side edge parallel to the fourth extending portion, a shortest distance β1 existing between the plurality of second disconnection regions and the side edge, a distance β3 existing between the adjacent second disconnection regions and third disconnection regions, at least one of the plurality of second disconnection regions having a width β2, at least one of the plurality of third disconnection regions having a width β4, and the plurality of second disconnection regions being arranged on the substrate in a period P3, and a shortest distance C1' existing between the plurality of fourth extending portions and the side edge, at least one of vertical projections of the plurality of fourth extending portions on the third extending portion having a width C2', and the plurality of fourth extending portions being arranged on the substrate in a period P4, wherein the plurality of third disconnection regions are respectively located within a coordinate range of [(t−1) P3+β1+β2+β3] to [(t−1) P3+β1+β2+β3+β4] based on the side edge, and the plurality of fourth extending portions are respectively located within a coordinate range of [(s−1) P4+C1'] to [(s−1) P4+C1'+C2'] based on the side edge, the coordinate range of [(t−1) P3+β1+β2+β3] to [(t−1) P3+β1+β2+β3+β4] not overlapping the coordinate range of [(s−1) P4+C1'] to [(s−1) P4+C1'+C2'], wherein s and t are positive integers.

6. The touch display panel according to claim 1, wherein the plurality of second disconnection regions are arranged on the substrate in a first period, and the plurality of fourth extending portions are arranged on the substrate in a second period, the first period being an integer multiple of the second period.

7. The touch display panel according to claim 1, further comprising:
an insulation layer disposed between the first mesh electrode and the second mesh electrode.

8. The touch display panel according to claim 1, wherein the first mesh electrode and the second mesh electrode are disposed on a same layer, and the first mesh electrode is electrically independent of the second mesh electrode.

9. The touch display panel according to claim 1, further comprising:
a display medium layer; and
a pixel array substrate, wherein the display medium layer is disposed between the pixel array substrate and the substrate.

10. A touch display panel, comprising:
a substrate; and
a first mesh electrode disposed on the substrate and comprising:
a plurality of first extending portions arranged along a first direction and extending in a second direction, wherein the first direction intersects with the second direction;
a plurality of second extending portions arranged along the second direction and extending in the first direction; and
a plurality of first disconnection regions arranged along the first direction and extending in the second direction, wherein the plurality of first disconnection regions overlap the plurality of second extending portions and do not overlap the plurality of first extending portions, wherein the plurality of first disconnection regions are arranged on the substrate in a period P1, and the plurality of first extending portions are arranged on the substrate in a period P2, the period P1 being not an integer multiple of the period P2.

11. A touch display panel, comprising:
a substrate; and
a first mesh electrode disposed on the substrate and comprising:
a plurality of first extending portions arranged along a first direction and extending in a second direction, wherein the first direction intersects with the second direction;
a plurality of second extending portions arranged along the second direction and extending in the first direction; and
a plurality of first disconnection regions arranged along the first direction and extending in the second direction, wherein the plurality of first disconnection regions overlap the plurality of second extending portions and do not overlap the plurality of first extending portions, wherein the substrate further comprises a first side edge parallel to the first extending portion, a shortest distance α1 existing between the plurality of first disconnection regions and the first side edge, at least one of the plurality of first disconnection regions having a width α2, and the plurality of first disconnection regions being arranged on the substrate in a period P1, and a shortest distance C1 existing between the plurality of first extending portions and the first side edge, at least one of vertical projections of the plurality of first extending portions on the second extending portions having a width C2, and the plurality of first extending portions being arranged on the substrate in a period P2, wherein the plurality of first disconnection regions are respectively located within a coordinate range of [(n−1) P1+α1] to [(n−1) P1+α1+α2] based on the first side edge, and the plurality of first extending portions are respectively located within a coordinate range of [(m−1) P2+C1] to [(m−1) P2+C1+C2] based on the first side edge, the coordinate range of [(n−1) P1+α1] to [(n−1) P1+α1+α2] not overlapping the coordinate range of [(m−1) P2+C1] to [(m−1) P2+C1+C2], wherein m and n are positive integers.

12. A touch display panel, comprising:
a substrate; and
a first mesh electrode disposed on the substrate and comprising:
a plurality of first extending portions arranged along a first direction and extending in a second direction, wherein the first direction intersects with the second direction;
a plurality of second extending portions arranged along the second direction and extending in the first direction; and
a plurality of first disconnection regions arranged along the first direction and extending in the second direction, wherein the plurality of first disconnection regions overlap the plurality of second extending portions and do not overlap the plurality of first extending portions, wherein the first mesh electrode further comprises a plurality of second disconnection regions alternately arranged with the plurality of first disconnection regions in the first direction, the plurality of second disconnection regions overlapping the plurality of second extending portions and not overlapping the plurality of first extending portions.

13. The touch display panel according to claim 12, wherein the substrate further comprises a first side edge parallel to the first extending portion, a shortest distance α1 existing between the plurality of first disconnection regions and the first side edge, a distance α3 existing between the adjacent first disconnection regions and second disconnection regions, at least one of the plurality of first disconnection regions having a width α2, at least one of the plurality of second disconnection regions having a width $\alpha 4$, and the plurality of first disconnection regions being arranged on the substrate in a period P1, and
   a shortest distance C1 existing between the plurality of first extending portions and the first side edge, at least one of vertical projections of the plurality of first extending portions on the second extending portions having a width C2, and the plurality of first extending portions being arranged on the substrate in a period P2,
wherein the plurality of second disconnection regions are respectively located within a coordinate range of $[(n-1) P1+\alpha 1+\alpha 2+\alpha 3]$ to $[(n-1) P1+\alpha 1+\alpha 2+\alpha 3+\alpha 4]$ based on the first side edge, and the plurality of first extending portions are respectively located within a coordinate range of $[(m-1) P2+C1]$ to $[(m-1) P2+C1+C2]$ based on the first side edge, the coordinate range of $[(n-1) P1+\alpha 1+\alpha 2+\alpha 3]$ to $[(n-1) P1+\alpha 1+\alpha 2+\alpha 3+\alpha 4]$ not overlapping the coordinate range of $[(m-1) P2+C1]$ to $[(m-1) P2+C1+C2]$, wherein m and n are positive integers.

14. A touch display panel, comprising:
a substrate; and
a first mesh electrode disposed on the substrate and comprising:
   a plurality of first extending portions arranged along a first direction and extending in a second direction, wherein the first direction intersects with the second direction;
   a plurality of second extending portions arranged along the second direction and extending in the first direction; and
   a plurality of first disconnection regions arranged along the first direction and extending in the second direction, wherein the plurality of first disconnection regions overlap the plurality of second extending portions and do not overlap the plurality of first extending portions, wherein the plurality of first disconnection regions are arranged on the substrate in a first period, and the plurality of first extending portions are arranged on the substrate in a second period, the first period being an integer multiple of the second period.

15. The touch display panel according to claim 14, further comprising:
   a second mesh electrode disposed on the substrate and comprising:
      a plurality of third extending portions alternately arranged with the plurality of first extending portions in the first direction;
      a plurality of fourth extending portions alternately arranged with the plurality of second extending portions in the second direction; and
      a plurality of second disconnection regions arranged along the second direction and extending in the first direction, wherein the plurality of second disconnection regions overlap the plurality of third extending portions and do not overlap the plurality of fourth extending portions.

16. The touch display panel according to claim 15, wherein the plurality of second disconnection regions are arranged on the substrate in a period P3, and the plurality of fourth extending portions are arranged on the substrate in a period P4, the period P3 being not an integer multiple of the period P4.

17. The touch display panel according to claim 16, wherein the substrate further comprises a side edge parallel to the fourth extending portion, a shortest distance $\beta 1$ existing between the plurality of second disconnection regions and the side edge, at least one of the plurality of second disconnection regions having a width $\beta 2$, and
   a shortest distance C1' existing between the plurality of fourth extending portions and the side edge, and at least one of vertical projections of the plurality of fourth extending portions on the third extending portions having a width C2',
wherein the plurality of second disconnection regions are respectively located within a coordinate range of $[(t-1) P3+\beta 1]$ to $[(t-1) P3+\beta 1+\beta 2]$ based on the side edge, and the plurality of fourth extending portions are respectively located within a coordinate range of $[(s-1) P4+C1']$ to $[(s-1) P4+C1'+C2']$ based on the side edge, the coordinate range of $[(t-1) P3+\beta 1]$ to $[(t-1) P3+\beta 1+\beta 2]$ not overlapping the coordinate range of $[(s-1) P4+C1']$ to $[(s-1) P4+C1'+C2']$, wherein s and t are positive integers.

18. The touch display panel according to claim 16, wherein the second mesh electrode further comprises a plurality of third disconnection regions alternately arranged with the plurality of second disconnection regions in the second direction, the plurality of third disconnection regions overlapping the plurality of third extending portions and not overlapping the plurality of fourth extending portions.

19. The touch display panel according to claim 18, wherein the substrate further comprises a side edge parallel to the fourth extending portion, a shortest distance $\beta 1$ existing between the plurality of second disconnection regions and the side edge, a distance $\beta 3$ existing between the adjacent second disconnection regions and third disconnection regions, at least one of the plurality of second disconnection regions having a width $\beta 2$, and at least one of the plurality of third disconnection regions having a width $\beta 4$, and
   a shortest distance C1' existing between the plurality of fourth extending portions and the side edge, and at least one of vertical projections of the plurality of fourth extending portions on the third extending portions having a width C2',
wherein the plurality of third disconnection regions are respectively located within a coordinate range of $[(t-1) P3+\beta 1+\beta 2+\beta 3]$ to $[(t-1) P3+\beta 1+\beta 2+\beta 3+\beta 4]$ based on the side edge, and the plurality of fourth extending portions are respectively located within a coordinate range of $[(s-1) P4+C1']$ to $[(s-1) P4+C1'+C2']$ based on the side edge, the coordinate range of $[(t-1) P3+\beta 1+\beta 2+\beta 3]$ to $[(t-1) P3+\beta 1+\beta 2+\beta 3+\beta 4]$ not overlapping the coordinate range of $[(s-1) P4+C1']$ to $[(s-1) P4+C1'+C2']$, wherein s and t are positive integers.

* * * * *